United States Patent
Song et al.

(10) Patent No.: US 8,927,305 B2
(45) Date of Patent: Jan. 6, 2015

(54) METHOD OF MANUFACTURING LIGHT EMITTING DEVICE

(75) Inventors: Jong Sup Song, Gyeonggi-do (KR); Jae Sung You, Gyeonggi-do (KR); Tae Gyu Kim, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 382 days.

(21) Appl. No.: 13/562,019

(22) Filed: Jul. 30, 2012

(65) Prior Publication Data

US 2013/0029439 A1  Jan. 31, 2013

(30) Foreign Application Priority Data

Jul. 28, 2011 (KR) .................. 10-2011-0075141

(51) Int. Cl.
*H01L 21/00* (2006.01)
*H01L 33/52* (2010.01)
*H01L 33/50* (2010.01)

(52) U.S. Cl.
CPC ............... *H01L 33/52* (2013.01); *H01L 33/505* (2013.01); *H01L 2933/0041* (2013.01); *H01L 2933/005* (2013.01); *H01L 2933/0091* (2013.01)
USPC .................. 438/27; 438/34; 438/127; 257/98; 257/E33.059

(58) Field of Classification Search
USPC ......... 438/27, 34, 127; 257/98–100, E33.059
See application file for complete search history.

(56) References Cited

U.S. PATENT DOCUMENTS 7,858,408 B2   12/2010   Mueller et al.
8,264,079 B2 *  9/2012   Iwase et al. .................. 257/737

FOREIGN PATENT DOCUMENTS

| | | |
|---|---|---|
| JP | 2008-145300 A | 6/2008 |
| JP | 2008-541412 | 11/2008 |
| JP | 2009-016779 A | 1/2009 |
| KR | 2008-0040778 A | 5/2008 |
| KR | 2008-0083377 A | 9/2008 |
| KR | 2009-0076101 A | 7/2009 |
| KR | 2010-0077517 A | 7/2010 |
| WO | WO-2006/121197 A1 | 11/2006 |

* cited by examiner

*Primary Examiner* — David Vu
(74) *Attorney, Agent, or Firm* — McDermott Will & Emery LLP

(57) ABSTRACT

There is provided a method of manufacturing a light emitting device, the method including: mounting a plurality of light emitting devices on an adhesive layer; arranging upper surfaces of the plurality of light emitting devices to be disposed horizontally using a pressing member; forming a wavelength conversion part covering the plurality of light emitting devices on the adhesive layer by applying a resin including at least one phosphor material; planarizing an upper surface of the wavelength conversion part using the pressing member; and separating the adhesive layer from the plurality of light emitting devices.

18 Claims, 6 Drawing Sheets

METHOD OF MANUFACTURING LIGHT EMITTING DEVICE

CROSS-REFERENCE TO RELATED APPLICATIONS

This application claims the priority of Korean Patent Application No. 10-2011-0075141 filed on Jul. 28, 2011, in the Korean Intellectual Property Office, the disclosure of which is incorporated herein by reference.

BACKGROUND OF THE INVENTION

1. Field of the Invention

The present invention relates to a method of manufacturing a light emitting device.

2. Description of the Related Art

In recent years, a light emitting diode (LED), emitting light according to electrical signals, has been widely used as a light source for various types of electronic products, as well as mobile communication terminals such as personal cellular phones, personal digital assistants (PDAs), or the like.

Such an LED is a light emitting device capable of emitting light of various colors by using compound semiconductor materials such as gallium arsenide (GaAs), aluminium gallium arsenide (AlGaAs), gallium nitride (GaN), indium gallium phosphide (InGaP), and the like.

LEDs may emit red light, blue light, green light or ultraviolet light according to compounds contained therein. White light may be produced by combining red light, blue light, and green light emitted from the respective LEDs. However, such a method of producing white light may require the use of a plurality of LEDs, and difficulties in color uniformity may occur.

Accordingly, a phosphor material for a wavelength conversion of light is generally mixed with a resin such as silicone or the like and a mixture thereof is applied to form a white light-emitting LED. Due to the mixture, blue light or ultraviolet light emitted from the LED is converted into white light, and thus monochromatic white light may be produced.

However, such a method of mixing the phosphor material with the resin and applying the mixture thereof to the LED has a problem in that the height of a wavelength conversion part formed on a surface of the LED may be uneven. In particular, in the case of LEDs manufactured on a mass production basis, requirements for the distribution of the height of the wavelength conversion part may not be satisfied.

SUMMARY OF THE INVENTION

An aspect of the present invention provides a method of manufacturing light emitting devices satisfying the requirements for the distribution of the height of a wavelength conversion part by allowing for uniformity in terms of the height of the wavelength conversion part when manufactured on a mass production basis.

According to an aspect of the present invention, there is provided a method of manufacturing a light emitting device, the method including: mounting a plurality of light emitting devices on an adhesive layer; arranging upper surfaces of the plurality of light emitting devices to be disposed horizontally using a pressing member; forming a wavelength conversion part covering the plurality of light emitting devices on the adhesive layer by applying a resin including at least one phosphor material; planarizing an upper surface of the wavelength conversion part using the pressing member; and separating the adhesive layer from the plurality of light emitting devices.

The mounting of the plurality of light emitting devices may include individually disposing the light emitting devices on the adhesive layer while allowing electrode pads provided on lower surfaces of the light emitting devices to contact the adhesive layer.

The arranging of the plurality of light emitting devices may include: disposing the pressing member on the plurality of light emitting devices in a balanced state using an automatic collimator; and compressing the upper surfaces of the plurality of light emitting devices using the pressing member.

The arranging of the plurality of light emitting devices may include controlling downward movement of the pressing member using a stopper catching a lower surface of the pressing member and stopping the downward movement thereof.

The arranging of the plurality of light emitting devices may include compressing the upper surfaces of the plurality of light emitting devices to be disposed coplanarly using the pressing member.

The forming of the wavelength conversion part may include covering the plurality of light emitting devices with the resin including the at least one phosphor material in a single printing process.

The planarizing of the upper surface of the wavelength conversion part may include disposing the pressing member on the upper surface of the wavelength conversion part in a balanced state using the automatic collimator.

The planarizing of the upper surface of the wavelength conversion part may include controlling downward movement of the pressing member using a stopper catching a lower surface of the pressing member and stopping the downward movement thereof.

The planarizing of the upper surface of the wavelength conversion part may include allowing intervals between the upper surfaces of the plurality of light emitting devices and the upper surface of the wavelength conversion part to be uniform.

The pressing member may be formed of a light transmissive material.

The pressing member may have a releasing agent on a lower surface thereof.

The method may further include curing the wavelength conversion part after the planarizing of the upper surface of the wavelength conversion part.

The method may further include dividing the wavelength conversion part into the individual light emitting devices by a dicing process.

The wavelength conversion part may have a lower surface roughness in an upper surface thereof than in a diced side surface thereof.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1A:
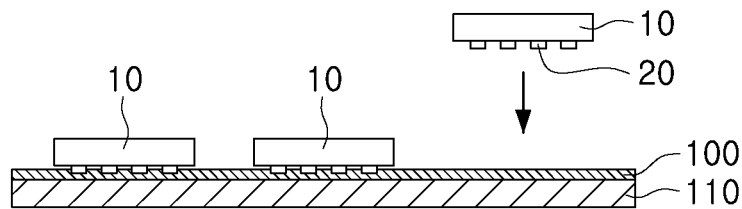
FIGS. 1A and 1B are schematic views illustrating mounting a plurality of light emitting devices on an adhesive layer according to an embodiment of the present invention.

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

With reference to FIGS. 1 through 11, a method of manufacturing a light emitting device according to an embodiment of the invention will be described below.

Figure 1B:
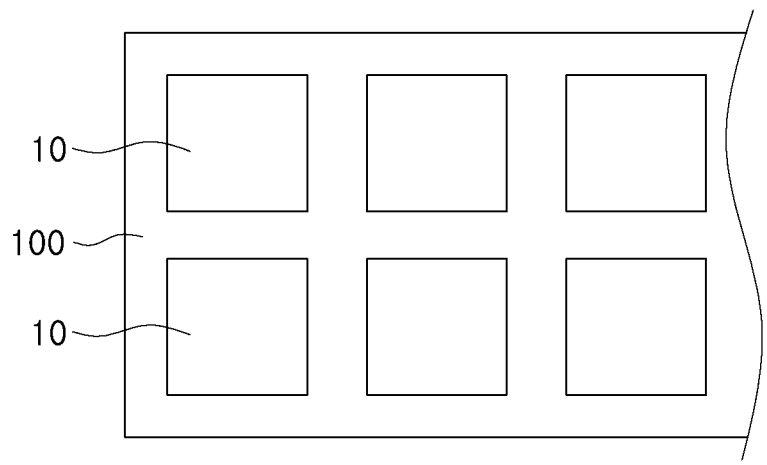
Figure 2:
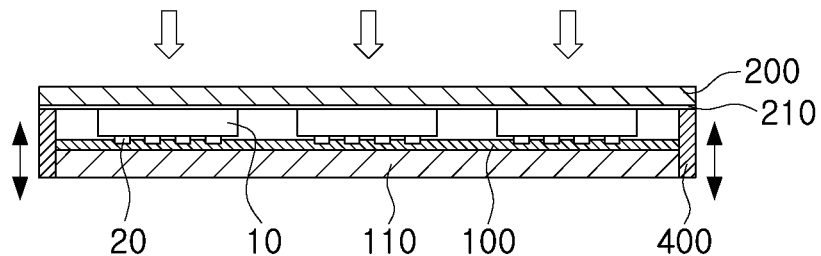
FIG. 2 is a schematic view illustrating compressing upper surfaces of the plurality of light emitting devices mounted on the adhesive layer of FIG. 1 using a pressing member.
Figure 3A:
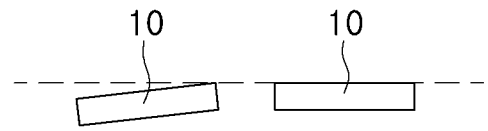
FIGS. 3A and 3B are schematic views illustrating the mounting state of the plurality of light emitting devices mounted on the adhesive layer of FIG. 1.
Figure 3B:
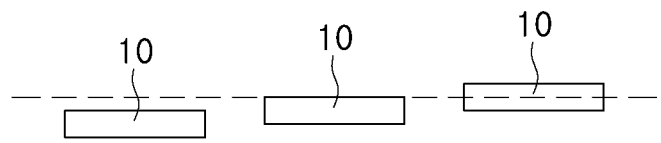
Figure 4:
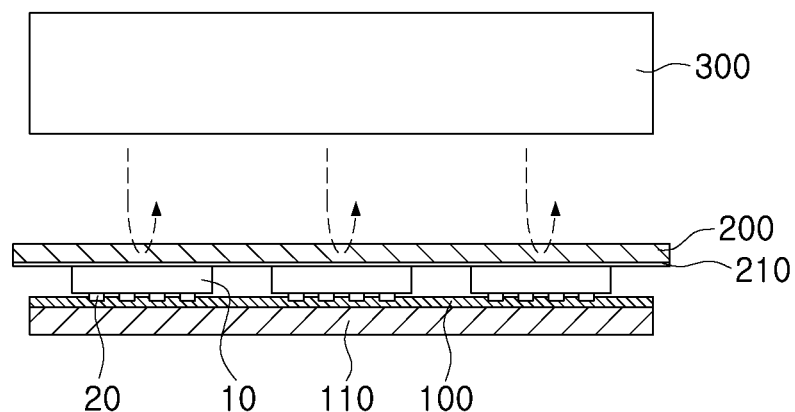
FIG. 4 is a schematic view illustrating maintaining the pressing member of FIG. 2 in a balanced state using an automatic collimator.

FIGS. 1A and 1B are schematic views illustrating mounting a plurality of light emitting devices on an adhesive layer according to an embodiment of the present invention. FIG. 2 is a schematic view illustrating compressing upper surfaces of the plurality of light emitting devices mounted on the adhesive layer of FIG. 1 using a pressing member. FIGS. 3A and 3B are schematic views illustrating the mounting state of the plurality of light emitting devices mounted on the adhesive layer of FIG. 1. FIG. 4 is a schematic view illustrating maintaining the pressing member of FIG. 2 in a balanced state using an automatic collimator.

Figure 5:
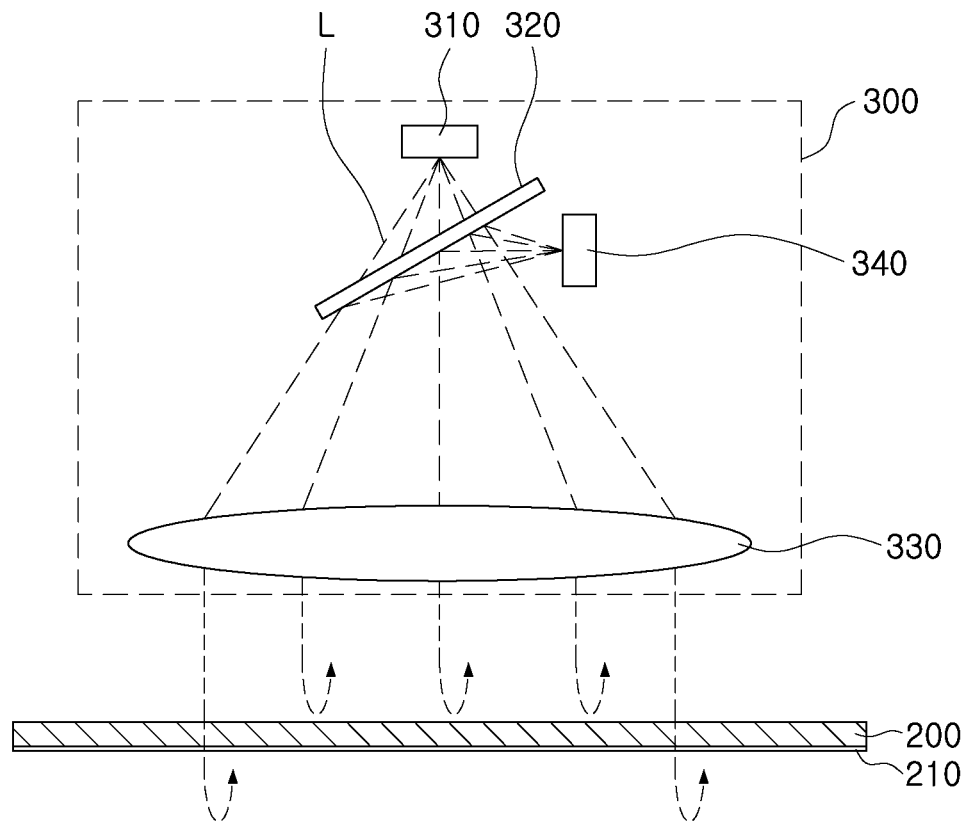
FIG. 5 is a schematic view illustrating the operational principles of the automatic collimator of FIG. 4.
Figure 6:
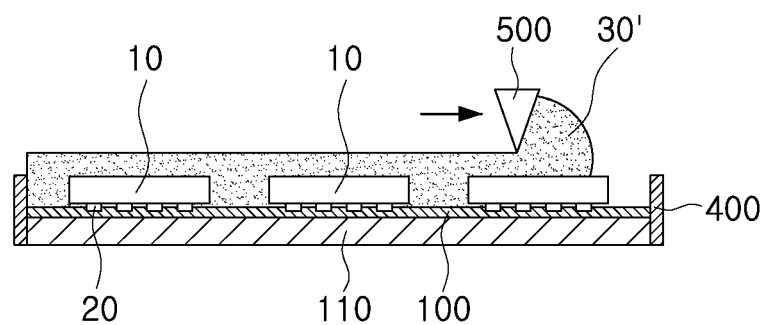
FIG. 6 is a schematic view illustrating applying a resin including a phosphor material to cover the plurality of light emitting devices.
Figure 7:
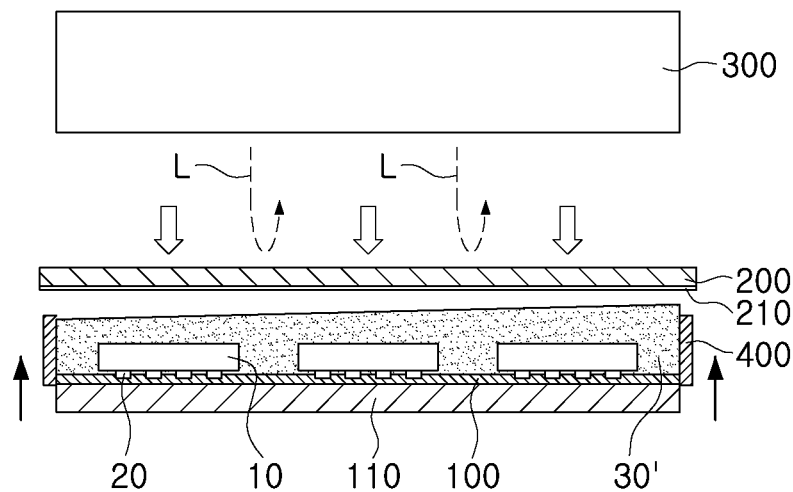
FIG. 7 is a schematic view illustrating planarizing an upper surface of the resin including the phosphor material of FIG. 6.
Figure 8:
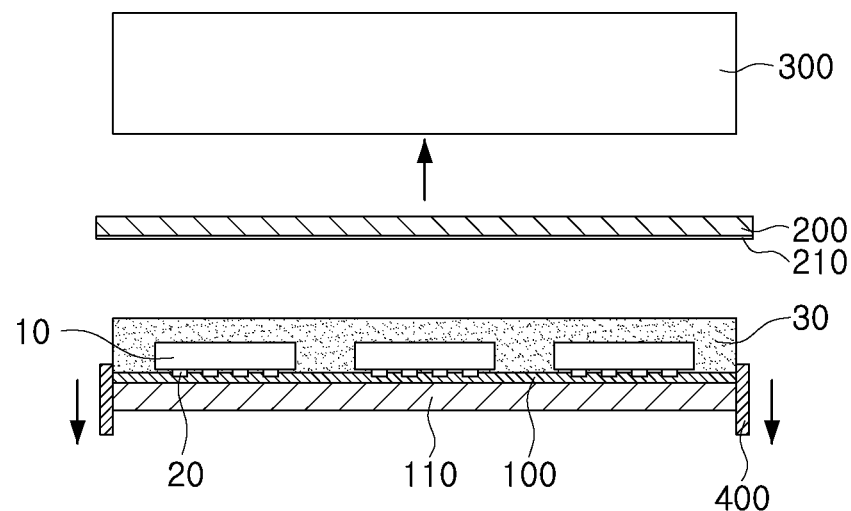
FIG. 8 is a schematic view illustrating forming a wavelength conversion part by curing the planarized resin including the phosphor material of FIG. 7.

FIG. 5 is a schematic view illustrating the operational principles of the automatic collimator of FIG. 4. FIG. 6 is a schematic view illustrating applying a resin including a phosphor material to cover the plurality of light emitting devices. FIG. 7 is a schematic view illustrating planarizing an upper surface of the resin including the phosphor material of FIG. 6. FIG. 8 is a schematic view illustrating forming a wavelength conversion part by curing the planarized resin including the phosphor material of FIG. 7.

Figure 9A:
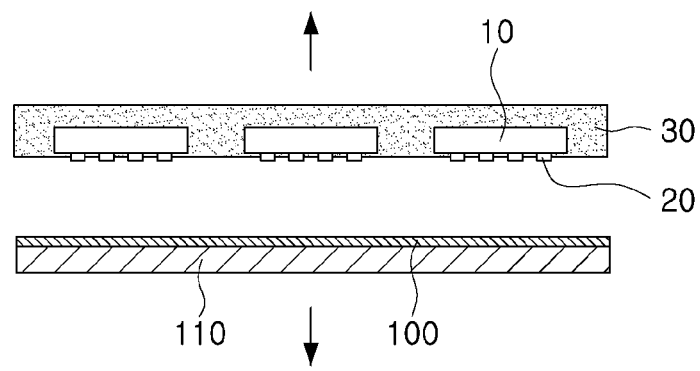
FIGS. 9A and 9B are schematic views illustrating separating the plurality of light emitting devices having the wavelength conversion part formed thereon from the adhesive layer.
Figure 9B:
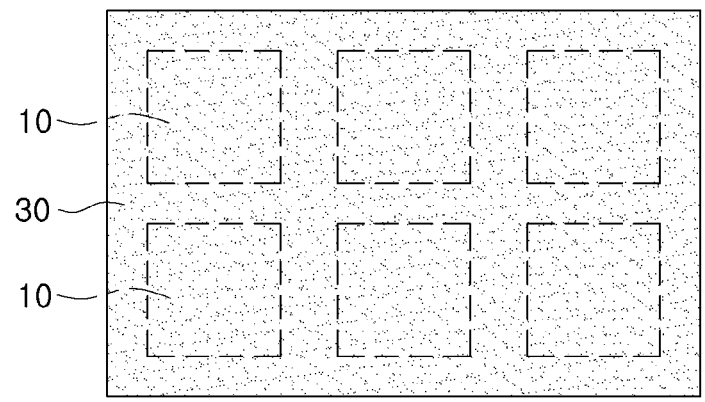
Figure 10:
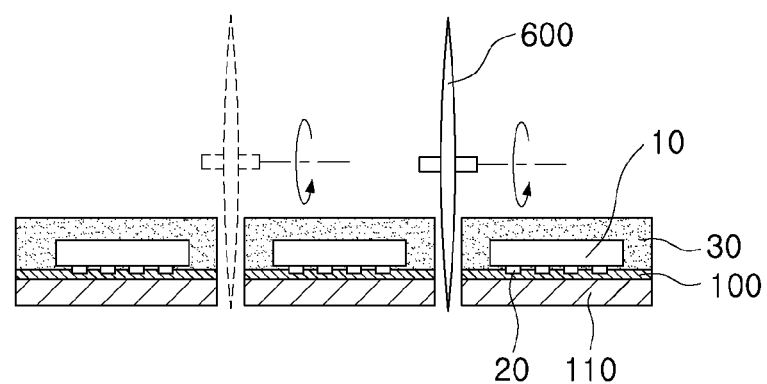
FIG. 10 is a schematic view illustrating the individual light emitting devices being divided by a cutting device.
Figure 11:
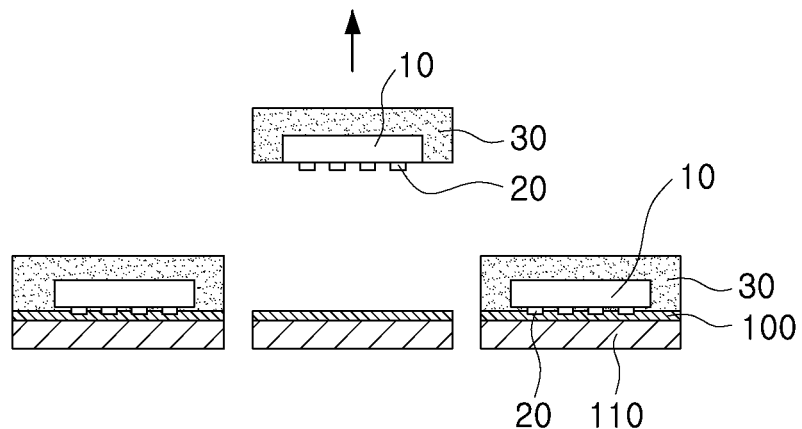
FIG. 11 is a schematic view illustrating separating the divided light emitting devices of FIG. 10 from the adhesive layer.

FIGS. 9A and 9B are schematic views illustrating separating the plurality of light emitting devices having the wavelength conversion part from the adhesive layer. FIG. 10 is a schematic view illustrating the individual light emitting devices being divided by a cutting device. FIG. 11 is a schematic view illustrating separating the divided light emitting devices of FIG. 10 from the adhesive layer.

First of all, as shown in FIG. 1, a plurality of light emitting devices 10 are mounted on an adhesive layer 100.

The adhesive layer 100 is a supporting member allowing for the mounting and fixing of the light emitting devices 10. A substrate 110 may be further provided on a lower surface of the adhesive layer 100 so as to support the adhesive layer 100 and allow it to be maintained horizontally. A fiducial mark (not shown) may be formed on an upper surface of the adhesive layer 100 such that it may indicate a mounting position of each light emitting device 10.

The light emitting device 10 may be a semiconductor device emitting light having a predetermined wavelength by electrical signals applied from the outside, and may include a light emitting diode (LED) chip. The light emitting device 10 may emit blue, red or green light according to materials contained therein, and may also emit white light.

The light emitting device 10 may include electrode pads 20 on a lower surface thereof in order to receive electrical signals from the outside, and may include a bare LED chip, on which a wavelength conversion part is not formed. For example, the electrode pads 20 may be a plurality of p-type and n-type electrodes. Although not shown, solder bumps may be further provided on the electrode pads.

The electrode pads 20 provided on the lower surfaces of the plurality of light emitting devices 10 are disposed to be in contact with the adhesive layer 100. The plurality of light emitting devices 10 may be spaced apart from each other with a predetermined interval therebetween. The plurality of light emitting devices 10 may form a matrix structure by being arranged in rows and columns.

Next, as shown in FIG. 2, the plurality of light emitting devices 10 arranged in the matrix structure are compressed by a pressing member 200 such that the upper surfaces thereof may be disposed coplanarly.

As shown in FIG. 3A, the upper surfaces of part of the plurality of light emitting devices 10 mounted on the adhesive layer 100 may be tilted at a predetermined angle, rather than being disposed in a horizontal manner with respect to the adhesive layer 100. As shown in FIG. 3B, part of the plurality of light emitting devices 10 may be disposed higher than or lower than adjacent light emitting devices 10.

The pressing member 200 may compress the upper surfaces of the plurality of light emitting devices 10 mounted on the adhesive layer 100 simultaneously, thereby allowing the entirety of the upper surfaces thereof to be disposed coplanarly.

Specifically, as shown in FIG. 4, the pressing member 200 may be disposed on the plurality of light emitting devices in a horizontally balanced state using an automatic collimator 300.

The pressing member 200 may have a plate structure able to cover the entirety of the plurality of light emitting devices 10. The pressing member 200 may be formed of a light transmissive material such as glass or transparent resin, such that it may be maintained in a horizontally balanced state through the automatic collimator 300.

The operational principles of the automatic collimator allowing the pressing member to be disposed in a balanced state will be described with reference to FIG. 5.

A light source 310 is provided in an upper portion of the automatic collimator 300 and a beam splitter 320 is provided below the light source 310. Under the beam splitter 320, a collimation lens 330 is provided in a lower portion of the automatic collimator 300. Further, a detector 340 is provided in a side of the beam splitter 320.

A laser beam L, emitted from the light source 310, passes through the beam splitter 320 and the collimation lens 330 and is reflected by an upper surface of the pressing member 200 and the upper surfaces of the light emitting devices 10. The reflected laser beam L passes through the collimation lens 330 and is reflected by the beam splitter 320, thereby being collected on the detector 340. The detector 340 may determine whether the pressing member 200 is in a balanced state or not using the reflected beam L.

When the pressing member 200 is disposed on the plurality of light emitting devices 10 in a balanced state using the automatic collimator 300, the entirety of the upper surfaces of the plurality of light emitting devices 10 are compressed by the pressing member 200 as shown in FIG. 2. In this manner, the plurality of light emitting devices 10 may be arranged in a horizontal manner such that the entirety of the upper surfaces thereof are disposed coplanarly.

At this time, a stopper 400 may stop the moving of the pressing member 200 by allowing a lower surface of the pressing member 200 to be caught thereby, such that an extent of downward movement of the pressing member 200 may be controlled. The stopper 400 may move vertically at both edges of the adhesive layer 100. The stopper 400 may contact edge portions of the pressing member 200 and stop the pressing member 200 from moving downwardly at a predetermined level. The stopper 400 may be moved vertically by a controller (not shown).

Then, as shown in FIG. 6, a resin 30' including at least one phosphor material is applied to cover the entirety of the plurality of light emitting devices 10 on the adhesive layer 100, thereby forming a wavelength conversion part 30.

Specifically, a predetermined amount of the resin 30' including the at least one phosphor material is applied to the adhesive layer 100 by a dispenser (not shown) or the like. The resin 30' may be applied in an amount sufficient to cover the entirety of the plurality of light emitting devices 10.

The applied resin 30' may be spread from one edge of the adhesive layer 100 to the other edge thereof using a squeegee 500 or the like. The resin 30' is applied to cover the entirety of the individual light emitting devices 10 in a single printing process.

In the case in which the resin 30' including the at least one phosphor material is applied to cover the entirety of the plurality of light emitting devices 10 in a single printing process, processing time may be reduced; however, a height of the wavelength conversion part 30 may be uneven. That is, the resin may be applied to have an inclined structure such that the height of the wavelength conversion part 30 may be higher in one portion thereof than in the other portion thereof.

Therefore, after the resin 30' including the at least one phosphor material is applied to cover the entirety of the plurality of light emitting devices 10, the upper surface of the resin 30', that is, of the wavelength conversion part 30 is planarized by the pressing member 200 as shown in FIG. 7 so as to allow for uniform intervals between the upper surfaces of the individual light emitting devices 10 and the upper surface of the wavelength conversion part 30.

Specifically, as shown in FIG. 7, the pressing member 200 may be disposed on the resin 30' to be formed as the wavelength conversion part 30 in a balanced state using the automatic collimator 300.

The pressing member 200 may have a plate structure able to cover the entirety of the applied resin 30'. The pressing member 200 may be formed of a light transmissive material such as glass or transparent resin, such that it may be maintained in a balanced state through the automatic collimator 300.

When the pressing member 200 is disposed on the resin 30' in a balanced state through the automatic collimator 300, the entirety of the upper surface of the resin 30' is uniformly compressed by the pressing member 200. In this manner, the upper surface of the applied resin 30' is planarized while allowing for uniform intervals between the upper surfaces of the plurality of light emitting devices 10 and the upper surface of the resin 30'.

At this time, the stopper 400 may stop the moving of the pressing member 200 by allowing the lower surface of the pressing member 200 to be caught thereby, such that an extent of downward movement of the pressing member 200 is controlled. The stopper 400 may move vertically at the both edges of the adhesive layer 100. The stopper 400 may contact the edge portions of the pressing member 200 and stop the pressing member 200 from moving downwardly at a predetermined level. The stopper 400 may move vertically by the controller (not shown).

Then, as shown in FIG. 8, the pressing member 200 is separated from the planarized resin 30', and the resin 30' is cured, thereby forming the wavelength conversion part 30 on the adhesive layer 100. Therefore, the wavelength conversion part 30 formed on the adhesive layer 100 may have a uniform structure in terms of height, concentration and the like.

At this time, a releasing agent 210 may be provided on the lower surface of the pressing member 200 so as to facilitate separation of the pressing member 200 from the resin 30'. The releasing agent 210 may be provided as a thin film on the lower surface of the pressing member 200 by application or coating.

In this manner, when the resin 30' including the at least one phosphor material is applied to cover the entirety of the plurality of light emitting devices 10 in a single printing process, processing time may be reduced. Furthermore, the entirety of the wavelength conversion part 30 having the same characteristics is formed in a single process, whereby yield rate may be increased.

The wavelength conversion part 30 converts a wavelength of light emitted from the light emitting device 10 into a wavelength of light having a desired color. For example, the wavelength conversion part 30 may convert monochromatic light such as red light or blue light into white light. To enable this, the resin 30' forming the wavelength conversion part 30 may include at least one phosphor material, and may further include an ultraviolet ray absorbent absorbing ultraviolet rays produced in the light emitting device 10.

The wavelength conversion part 30 may be formed on the adhesive layer 100 by applying the resin to cover the light emitting device 10 and curing the resin. The wavelength conversion part 30 may be formed of a resin having high transparency allowing light produced in the light emitting device 10 to pass therethrough with a minimal loss. For example, elastic resin may be used. Elastic resin refers to gel-type resin such as silicone, which exhibits a minimal change by single-wavelength light, such as yellowing, while having high refractivity, thus demonstrating excellent optical characteristics. Further, unlike epoxy, it maintains a gel or elastomer state even after being cured, and thus can stably protect the light emitting device from thermal stress, vibrations and external impacts. In addition, since the wavelength conversion part 30 is applied in a gel-state and is then cured, air bubbles therein may be exposed to the external air to thereby be easily expelled to the outside during the curing process.

Then, as shown in FIGS. 9A and 9B, the plurality of light emitting devices 10 having the wavelength conversion part 30 formed thereon are separated from the adhesive layer 100.

Due to the wavelength conversion part 30 sealing the entirety of the plurality of light emitting devices 10, the entirety of the plurality of light emitting devices 10 may be used as a light source module for a lighting apparatus.

Meanwhile, as shown in FIG. 10, the plurality of light emitting devices 10 having the wavelength conversion part 30 formed thereon may be divided into the individual light emitting devices by a dicing process before being separated from the adhesive layer 100.

Specifically, the wavelength conversion part 30 and the adhesive layer 100 are diced on the basis of intervals among the light emitting devices 10 using a cutting device 600, whereby the division of the individual light emitting devices may be performed.

Then, as shown in FIG. 11, the individual light emitting devices 10 having the wavelength conversion part 30 formed thereon are separated from the adhesive layer 100, thereby being manufactured on a mass production basis.

The wavelength conversion part 30 formed on the surface of the light emitting device 10 manufactured by the above-described method has differing surface roughness on upper and side surfaces thereof. That is, the surface roughness of the side surface of the wavelength conversion part 30 diced by the cutting device 600 is greater than that of the upper surface of the wavelength conversion part 30 planarized by the pressing member 200.

In the case in which the side surface of the wavelength conversion part 30 has a greater surface roughness than the upper surface thereof, light produced in the light emitting device and moving toward the side surface is reflected or refracted toward the upper surface such that an amount of light emitted toward the upper surface may be increased. Therefore, light emission efficiency may be improved.

In this manner, in the plurality of light emitting devices 10 manufactured on a mass production basis, the entirety of the wavelength conversion part 30 has a uniform thickness (or height) and the requirements for the distribution of the height of the wavelength conversion part 30 may be satisfied. Therefore, the generation of defects may be reduced, and accordingly, productivity may be enhanced.

Figure 12:
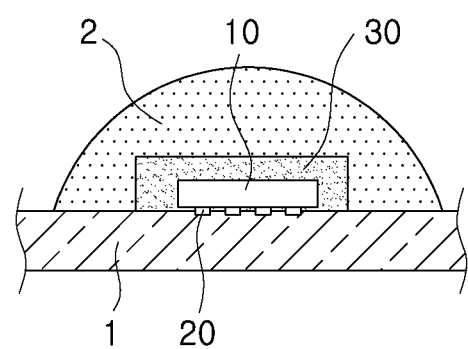
FIG. 12 is a schematic view illustrating a light source module for a lighting apparatus using a light emitting device having a wavelength conversion part thereon.

FIG. 12 is a schematic view illustrating a light source module for a lighting apparatus using a light emitting device having a wavelength conversion part thereon. As shown in FIG. 12, the light emitting device 10 having the wavelength conversion part 30 thereon is mounted on a circuit board 1 by a flip chip bonding method, whereby a light source module for a lighting apparatus may be manufactured. In this case, a process of forming a separate wavelength conversion part for each module is unnecessary, and accordingly, a manufacturing process may be simplified and manufacturing costs may be reduced.

A lens 2 may be further provided on the circuit board 1, such that the lens 2 may seal the light emitting device 10 together with the wavelength conversion part 30.

As set forth above, according to embodiments of the invention, when a plurality of light emitting devices having a wavelength conversion part thereon are manufactured on a mass production basis, the entirety of the wavelength conversion part has a uniform height, whereby the requirements for the distribution of the height of the wavelength conversion part may be satisfied.

While the present invention has been shown and described in connection with the embodiments, it will be apparent to those skilled in the art that modifications and variations can be made without departing from the spirit and scope of the invention as defined by the appended claims.

What is claimed is:

1. A method of manufacturing a light emitting device, the method comprising:
   mounting a plurality of light emitting devices on an adhesive layer;
   arranging upper surfaces of the plurality of light emitting devices to be disposed horizontally using a pressing member;
   forming a wavelength conversion part covering the plurality of light emitting devices on the adhesive layer by applying a resin including at least one phosphor material;
   planarizing an upper surface of the wavelength conversion part using the pressing member; and
   separating the adhesive layer from the plurality of light emitting devices.

2. The method of claim 1, wherein the mounting of the plurality of light emitting devices comprises disposing the light emitting devices on the adhesive layer while allowing electrode pads provided on lower surfaces of the light emitting devices to contact the adhesive layer.

3. The method of claim 1, wherein the arranging of the plurality of light emitting devices comprises:
   disposing the pressing member on the plurality of light emitting devices in a balanced state using an automatic collimator; and
   compressing the upper surfaces of the plurality of light emitting devices using the pressing member.

4. The method of claim 3, wherein the arranging of the plurality of light emitting devices comprises controlling downward movement of the pressing member using a stopper catching a lower surface of the pressing member and stopping the downward movement thereof.

5. The method of claim 3, wherein the arranging of the plurality of light emitting devices comprises compressing the upper surfaces of the plurality of light emitting devices to be disposed coplanarly using the pressing member.

6. The method of claim 1, wherein the arranging of the plurality of light emitting devices comprises controlling downward movement of the pressing member using a stopper catching a lower surface of the pressing member and stopping the downward movement thereof.

7. The method of claim 1, wherein the arranging of the plurality of light emitting devices comprises compressing the upper surfaces of the plurality of light emitting devices to be disposed coplanarly using the pressing member.

8. The method of claim 1, wherein the forming of the wavelength conversion part comprises covering the plurality of light emitting devices with the resin including the at least one phosphor material in a single printing process.

9. The method of claim 1, wherein the planarizing of the upper surface of the wavelength conversion part comprises disposing the pressing member on the upper surface of the wavelength conversion part in a balanced state using an automatic collimator.

10. The method of claim 9, wherein the planarizing of the upper surface of the wavelength conversion part comprises controlling downward movement of the pressing member using a stopper catching a lower surface of the pressing member and stopping the downward movement thereof.

11. The method of claim 9, wherein the planarizing of the upper surface of the wavelength conversion part comprises allowing intervals between the upper surfaces of the plurality of light emitting devices and the upper surface of the wavelength conversion part to be uniform.

12. The method of claim 1, wherein the planarizing of the upper surface of the wavelength conversion part comprises controlling downward movement of the pressing member using a stopper catching a lower surface of the pressing member and stopping the downward movement thereof.

13. The method of claim 1, wherein the planarizing of the upper surface of the wavelength conversion part comprises allowing intervals between the upper surfaces of the plurality of light emitting devices and the upper surface of the wavelength conversion part to be uniform.

14. The method of claim 1, wherein the pressing member is formed of a light transmissive material.

15. The method of claim 14, wherein the pressing member has a releasing agent on a lower surface thereof.

16. The method of claim 1, further comprising curing the wavelength conversion part after the planarizing of the upper surface of the wavelength conversion part.

17. The method of claim 1, further comprising dividing the wavelength conversion part into the individual light emitting devices by a dicing process.

18. The method of claim 17, wherein the wavelength conversion part has a lower surface roughness in an upper surface thereof than in a diced side surface thereof.

* * * * *